United States Patent
Honda et al.

(10) Patent No.: US 8,344,321 B2
(45) Date of Patent: Jan. 1, 2013

(54) INFRARED IMAGING DEVICE

(75) Inventors: Hiroto Honda, Yokohama (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/358,056

(22) Filed: Jan. 25, 2012

(65) Prior Publication Data
US 2012/0119088 A1 May 17, 2012

Related U.S. Application Data

(63) Continuation of application No. PCT/JP2009/063408, filed on Jul. 28, 2009.

(51) Int. Cl.
*G01J 5/12* (2006.01)
(52) U.S. Cl. ........................................ 250/332
(58) Field of Classification Search .................. 250/332
See application file for complete search history.

(56) References Cited

U.S. PATENT DOCUMENTS
2002/0195563 A1* 12/2002 Iida et al. ..................... 250/332

FOREIGN PATENT DOCUMENTS
| JP | 10-23335 A | 1/1998 |
| JP | 2002-16841 A | 1/2002 |
| JP | 2002016841 A * | 1/2002 |
| JP | 2002-300475 | 10/2002 |
| JP | 2007-158916 A | 6/2007 |

OTHER PUBLICATIONS

International Search Report mailed Nov. 2, 2009, issued for PCT/JP2009/063408, filed Jul. 28, 2009 in English.
Tomohiro Ishikawa, et al., "Low-cost 320 x 240 uncooled IRFPA using conventional silicon IC process", SPIE, vol. 3698, Apr. 1999, pp. 556-564.

* cited by examiner

*Primary Examiner* — David Porta
*Assistant Examiner* — Shun Lee
(74) *Attorney, Agent, or Firm* — Oblon, Spivak, McClelland, Maier & Neustadt, L.L.P.

(57) ABSTRACT

An infrared imaging device according to an embodiment includes: an imaging area formed on a semiconductor substrate, the imaging area having a plurality of pixels arranged in a matrix form, the plurality of pixels including a plurality of reference pixels arranged in at least one row and a plurality of infrared detection pixels arranged in remaining rows to detect incident infrared rays, each of the reference pixels having a first thermoelectric conversion element, each of the infrared detection pixel having a thermoelectric conversion unit, the thermoelectric conversion unit having an infrared absorption film to absorb the incident infrared rays and convert the incident infrared rays to heat and a second thermoelectric conversion element to convert the heat obtained by the conversion conducted by the infrared absorption film to an electric signal.

7 Claims, 9 Drawing Sheets

A-A SECTION

B-B SECTION

INFRARED IMAGING DEVICE

CROSS-REFERENCE TO RELATED APPLICATION

This application is based upon and claims the benefit of priority from prior PCT/JP2009/063408 filed on Jul. 28, 2009 in Japan, the entire contents of which are incorporated herein by reference.

FIELD

Embodiments described herein relate generally to an infrared imaging device.

BACKGROUND

Since infrared rays have a merit that its permeability is high with respect to smoke and fog as compared with visible light, infrared imaging is possible night and day. Furthermore, since temperature information of a subject can also be obtained in the infrared imaging, the infrared imaging has a wide application range as in surveillance cameras and fire detection cameras not to speak of the defense field.

In recent years, development of "uncooled infrared imaging device" which does not need a cooling mechanism has become vigorous. The uncooled, i.e., thermal type infrared imaging device converts incident infrared rays having a wavelength of approximately 10μ to heat by using an infrared absorption film, and converts a temperature change in a heat sensitive part generated by the converted feeble heat to an electric signal by using some thermoelectric conversion element. The uncooled infrared imaging device obtains infrared image information by reading out the electric signal.

For example, an infrared imaging device using a silicon pn junction which converts a temperature change to a voltage change by giving a constant forward current is known (see, for example, JP-A-2002-300475 (KOKAI)). This infrared imaging device has a merit that mass production is possible by using a silicon LSI manufacturing process, using a SOI (Silicon on Insulator) substrate as a semiconductor substrate. Furthermore, since a row selection function is implemented by utilizing rectification characteristics of a silicon pn junction which is a thermoelectric conversion element, the infrared imaging device also has a merit that the pixel structure can be constructed extremely simply.

One of indexes which represent performance of the infrared imaging device is NETD (Noise Equivalent Temperature Difference) which represents the temperature resolution of the infrared imaging device. It is important to make the NETD small, i.e., make the detected temperature difference corresponding to noise small. For making the NETD small, it is necessary to raise the signal sensitivity and reduce the noise.

Threshold voltage clamp processing for reducing the influence of the threshold variation of the amplification transistor is described in JP-A-2002-300475 (KOKAI). In this threshold voltage clamp processing, if a sampling transistor turns on, a negative charge is stored in a gate of an amplification transistor capacitor-coupled to a signal line. At this time, it is desirable to cause a voltage across a coupling capacitance between a signal line and the amplification transistor to converge to (Vdd−Vref)−Vth. Here, Vdd is a bias voltage given to a pixel by a row selection circuit, Vref is a voltage given from a constant current source to a signal line, and Vth is a threshold voltage of a pixel. In the threshold voltage clamp processing, the variation of the threshold voltage in amplification transistors in respective columns can be compensated at the time of signal readout. The instant the threshold voltage is clamped, however, a noise component existing on a signal line is held and thereafter its information is always referred to at the time of the row selection. This results in a problem that longitudinal streak noise appears.

DETAILED DESCRIPTION

An infrared imaging device according to an embodiment includes: a semiconductor substrate; an imaging area formed on the semiconductor substrate, the imaging area having a plurality of pixels arranged in a matrix form, the plurality of pixels including a plurality of reference pixels arranged in at least one row and a plurality of infrared detection pixels arranged in remaining rows to detect incident infrared rays, each of the reference pixels having a first thermoelectric conversion element, each of the infrared detection pixel having a thermoelectric conversion unit, the thermoelectric conversion unit having an infrared absorption film to absorb the incident infrared rays and convert the incident infrared rays to heat and a second thermoelectric conversion element to convert the heat obtained by the conversion conducted by the infrared absorption film to an electric signal; a plurality of row selection lines provided in the imaging area to be associated with the rows of the plurality of pixels, each of the row selection lines being connected to first terminals of the first and second thermoelectric conversion elements of the pixels in an associated row to select a pixel in the associated row; a plurality of signal lines provided in the imaging area to be associated with columns of the plurality of pixels, each of the signal lines being connected to second terminals of the first and second thermoelectric conversion elements of the pixels in an associated column to read out an electric signal from a pixel in the associated column; a plurality of sample units provided to be associated with the signal lines, each of the sample units sampling and holding electric signals of pixels in an identical row sent from an associated signal line; a plurality of amplification units provided to be associated with the sample units, each of the amplification units amplifying and outputting the electric signal held by an associated sample unit; a readout unit which reads out outputs of the plurality of amplification units successively; an AD conversion unit which conducts AD conversion on the electric signal read out by the readout unit; a memory unit which calculates and stores an average value of electric signals from the plurality of reference pixels converted by the AD conversion unit, every pixel column; and a subtraction unit which calculates a difference between an electric signal from the plurality of infrared detection pixels converted by the AD conversion unit and the average value stored in the memory unit, every pixel column.

Hereafter, embodiments will be described with reference to the drawings.

Figure 1:
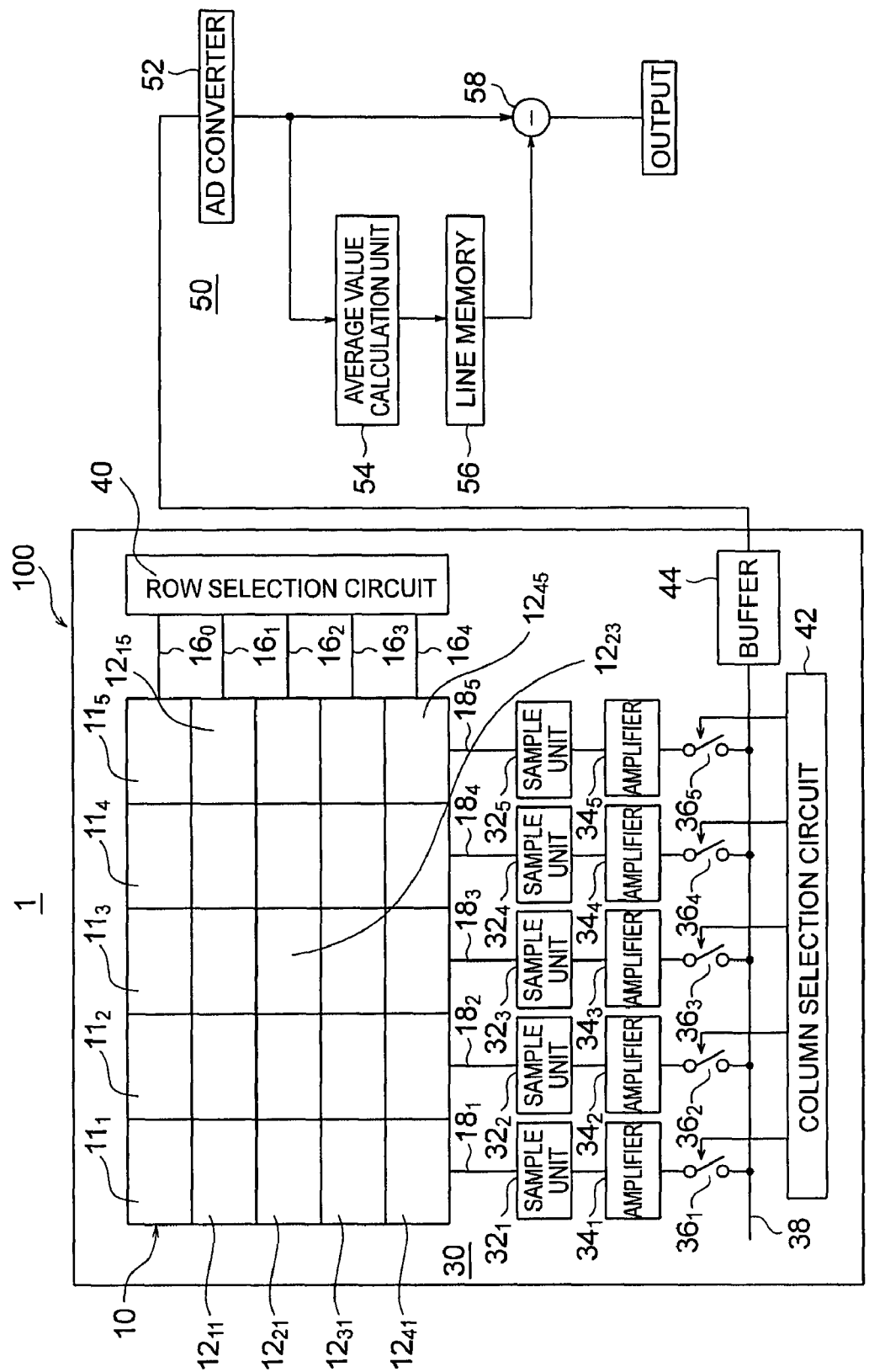
FIG. 1 is a block diagram showing an infrared imaging device according to an embodiment of the present invention.

An infrared imaging device according to an embodiment is shown in FIG. 1. The infrared imaging device according to the present embodiment includes an infrared detection unit 1 and a signal processing unit 50. The infrared detection unit 1 is formed on a semiconductor substrate 100. The infrared detection unit 1 includes an imaging area 10 including pixels arranged in a matrix form, a readout circuit 30, a row selection circuit 40, a column selection circuit 42, and a buffer 44.

The imaging area 10 includes, for example, 25 pixels $11_1$ to $11_5$ and $12_{11}$ to $12_{45}$ arranged in five rows by five columns. Typically, the imaging area includes more than 25 pixels. In the present embodiment, however, it is supposed that the imaging area 10 includes 25 pixels for brevity of description. The pixels $11_1$ to $11_5$ arranged in a first row are insensitive pixels having no sensitivity to infrared rays. These insensitive pixels are referred to as reference pixels as well. The pixels $12_{11}$ to $12_{45}$ arranged in second to fifth rows are sensitive pixels capable of detecting infrared rays. The sensitive pixels are referred to as infrared detection pixels as well. The insensitive pixels $11_1$ to $11_5$ may be either thermal insensitive pixels or optical insensitive pixels. A structure of the thermal insensitive pixel or optical insensitive pixel will be described later. Each of the pixels $11_1$ to $11_5$ and $12_{11}$ to $12_{45}$ has at least one thermoelectric conversion element, for example, such as a diode formed of a pn junction. Pixels on an i-th (i=1, 2, 3, 4, 5) row are connected to the row selection circuit 40 via a row selection line $16_{i-1}$. If the row selection circuit 40 selects the row selection line $16_{i-1}$, the pixels on the ith row are selected. Furthermore, pixels in a j-th (j=1, 2, 3, 4, 5) column are connected to a vertical signal line $18_j$, and a pixel signal subjected to thermoelectric conversion is read out via the associated vertical signal line $18_j$.

The readout circuit 30 is provided to be associated with the vertical signal lines. The readout circuit 30 includes sample units $32_1$ to $32_5$ which sample electric signals supplied from associated vertical signal lines, amplification units $34_1$ to $34_5$ which are provided to be associated with the vertical signal lines and which amplify electric signals sampled by the sample units $32_1$ to $32_5$, column selection switches $36_1$ to $36_5$ provided to be associated with the vertical signal lines, and a horizontal signal line 38. The column selection switches $36_1$ to $36_5$ are selected by the column selection circuit 42. These column selection switches $36_1$ to $36_5$ are typically formed of transistors, and referred to as column selection transistors as well.

Figure 2:
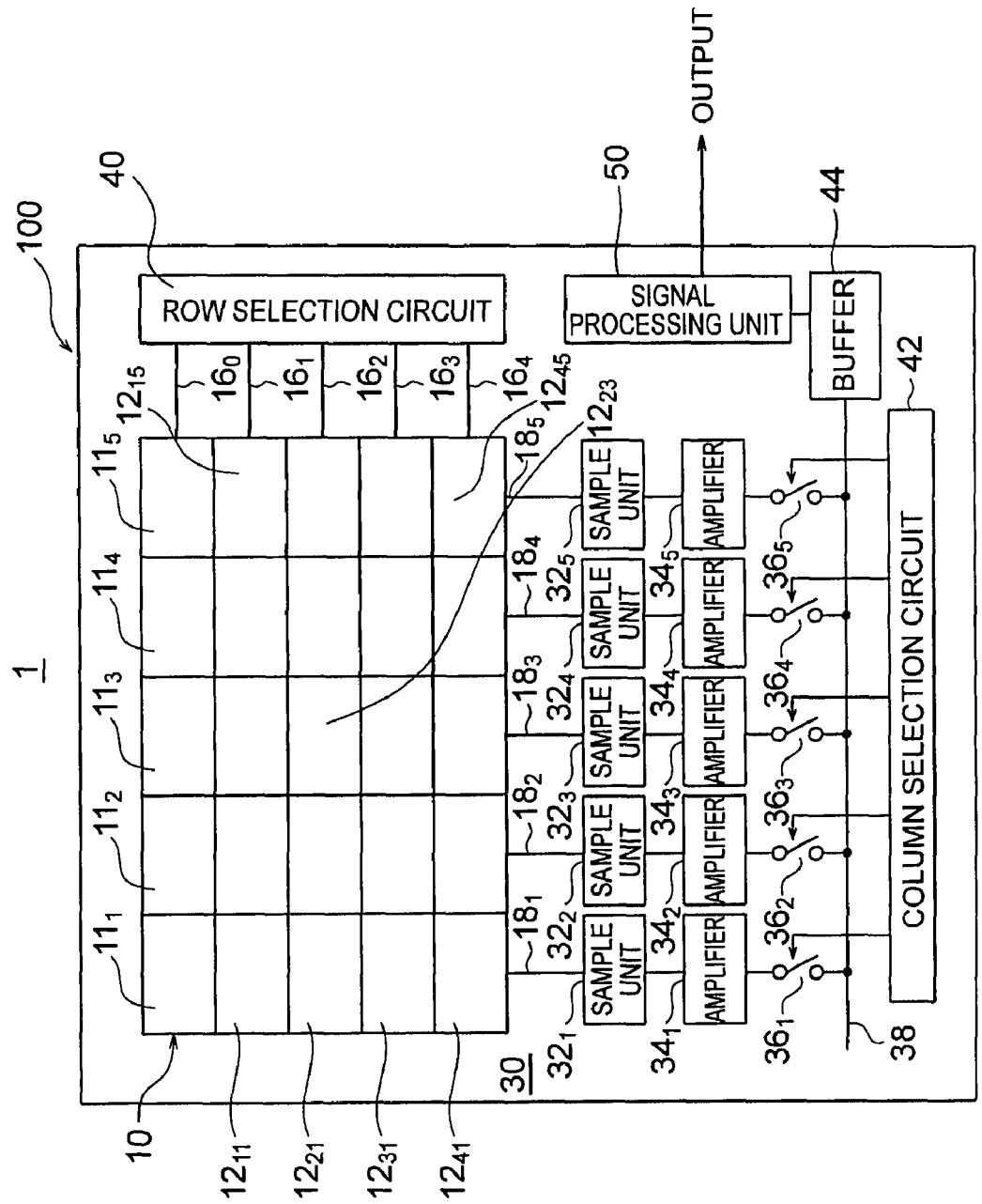
FIG. 2 is a block diagram showing an infrared imaging device according to a modification of the embodiment.

The signal processing unit 50 includes an AD conversion unit 52, an average value calculation unit 54, a line memory 56, and a subtraction unit 58. Configurations and actions of the AD conversion unit 52, the average value calculation unit 54, the line memory 56, and the subtraction unit 58 will be described in detail later. In the present embodiment, the signal processing unit 50 is not provided on the semiconductor substrate 100. As shown in a modification of the present embodiment in FIG. 2, however, the signal processing unit 50 may be provided on the semiconductor substrate 100.

Figure 3:
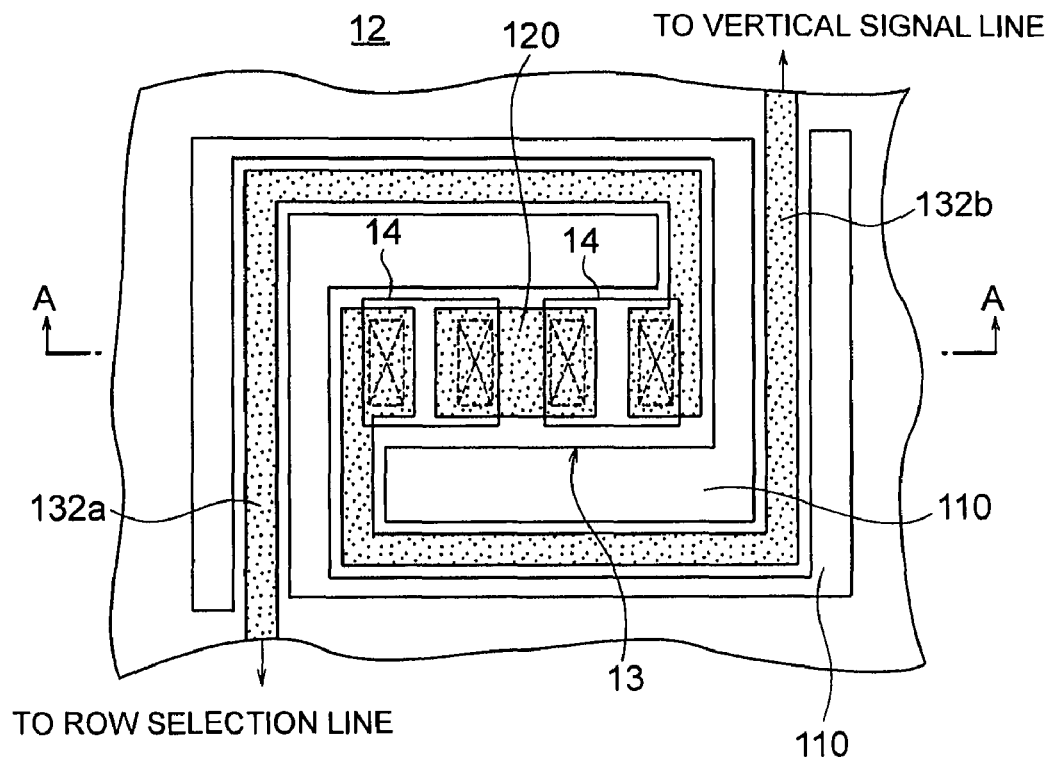
FIG. 3 is a top view of an infrared detection pixel used in the infrared imaging device according to the embodiment.
Figure 4:
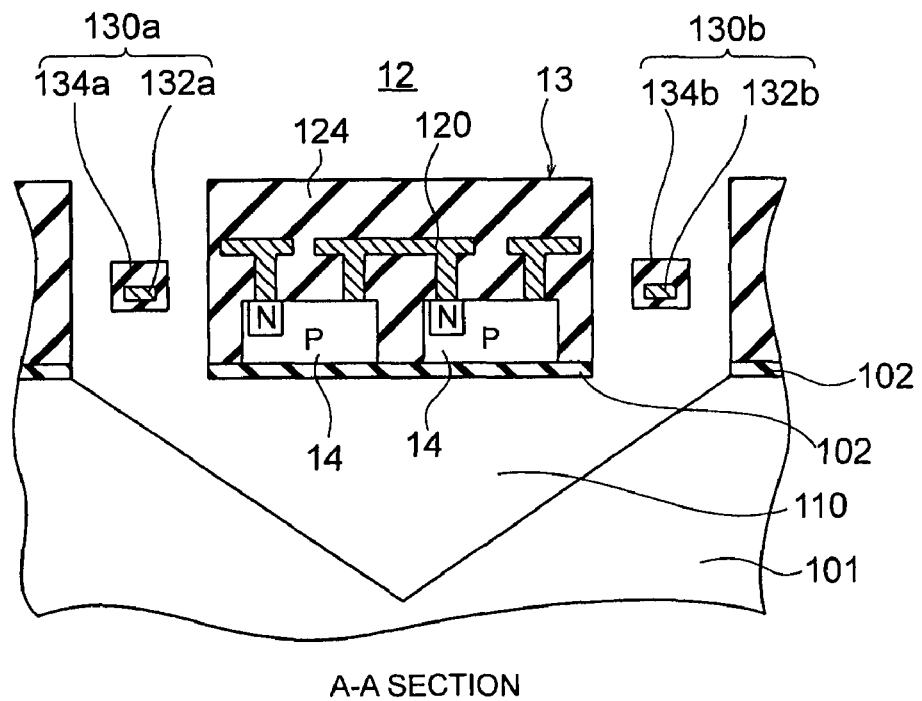
FIG. 4 is a sectional view of the infrared detection pixel taken along a cut line A-A shown in FIG. 3.

A structure of a sensitive pixel in the infrared imaging device according to the present embodiment will now be described with reference to FIGS. 3 and 4. FIG. 3 is a top view of the sensitive pixel 12 in the infrared imaging device according to the present embodiment. FIG. 4 is a sectional view of the sensitive pixel 12 taken along a cut line A-A shown in FIG. 3. The sensitive pixel 12 is formed on a SOI substrate. The SOI substrate includes a support substrate 101, a buried insulation layer (BOX layer) 102, and a SOI (Silicon-On-Insulator) layer formed of silicon single crystal. A concave part 110 is formed in a surface part. The sensitive pixel 12 includes a thermoelectric conversion unit 13 formed in the SOI layer, and support structure units 130a and 130b which support the thermoelectric conversion unit 13 over the concave part 110. The thermoelectric conversion unit 13 includes a plurality of (in FIGS. 3 and 4, two) diodes 14 connected in series, a wiring 120 which connects these diodes 14, and an infrared absorption film 124 formed to cover these diodes 14 and the wiring 120. The support structure unit 130a includes a connection wiring 132a connected at its first terminal to an associated row selection line and connected at its second terminal to a first terminal of a series circuit formed of diodes connected in series, and an insulation film 134a which covers the connection wiring 132a. The other support structure unit 130b includes a connection wiring 132b connected at its first terminal to an associated vertical signal line and connected at its second terminal to a second terminal of the series circuit formed of the diodes connected in series, and an insulation film 134b which covers the connection wiring 132b.

The infrared absorption film 124 generates heat in response to incident infrared rays. The diodes 14 convert the heat generated by the infrared absorption film 124 to an electric signal. The support structure units 130a and 130b are formed to be long and narrow and surround the periphery of the thermoelectric conversion unit 13. As a result, the thermoelectric conversion unit 13 is supported over the SOI substrate in a state in which the thermoelectric conversion unit 13 is practically thermally insulated from the SOI substrate.

Since the sensitive pixel 12 has such a structure, the sensitive element 12 can accumulate the heat generated according to the incident infrared rays and output a voltage based on the heat to a signal line.

A bias voltage Vd supplied from the row selection line is transferred to the diodes 14 via the wiring 132a. A signal passed through the diodes 14 is transferred to a vertical signal line via the wiring 132b.

Figure 5:
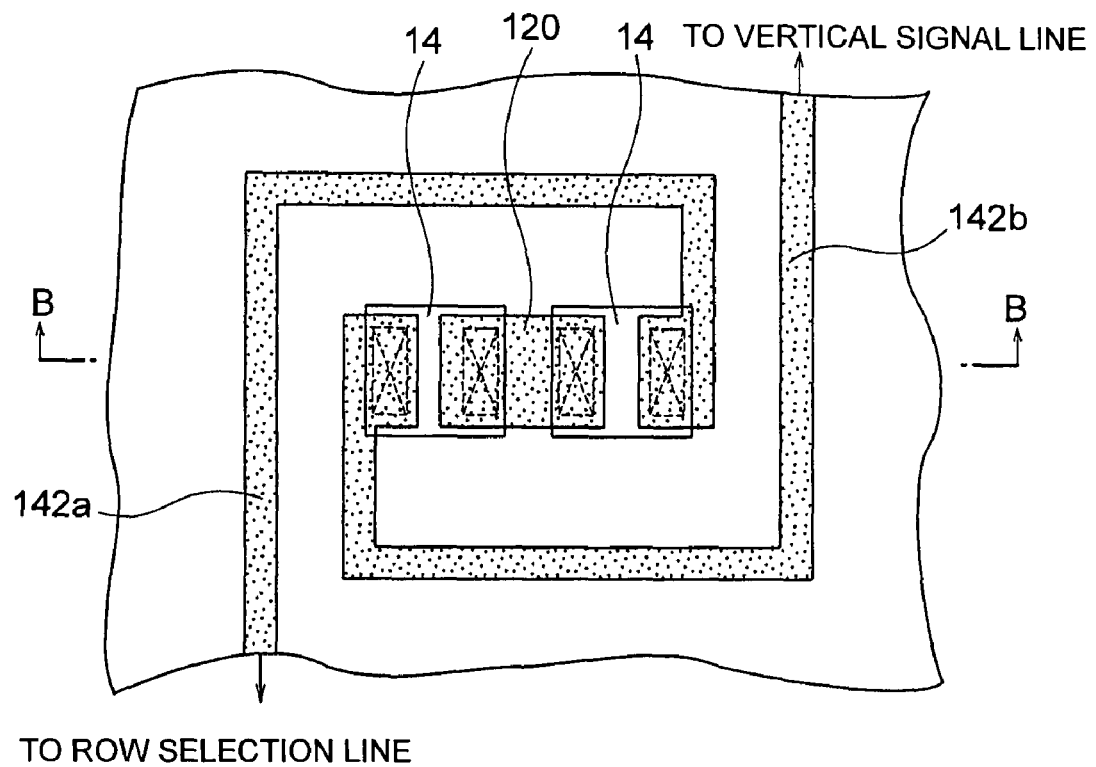
FIG. 5 is a top view of a thermal insensitive pixel used in the infrared imaging device according to the embodiment.
Figure 6:
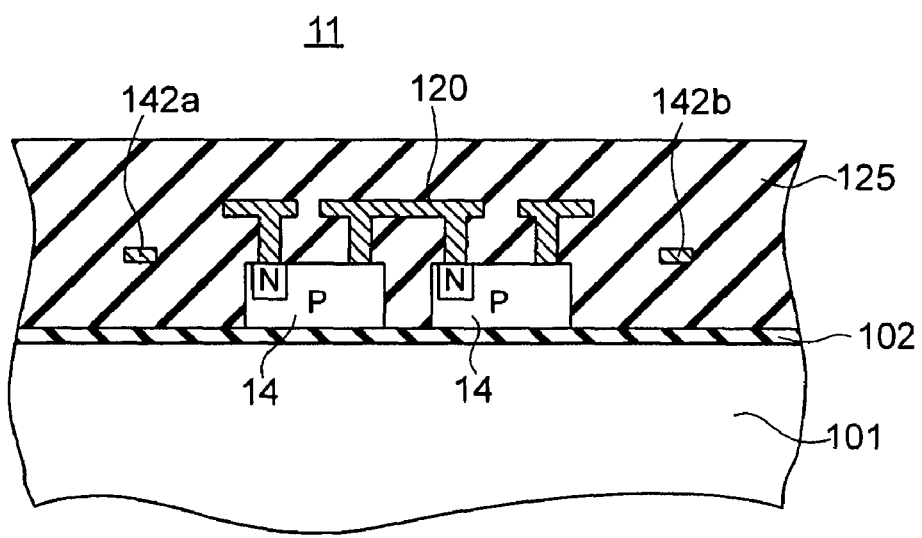
FIG. 6 is a sectional view of the thermal insensitive pixel taken along a cut line B-B shown in FIG. 5.

A structure of a concrete example of an insensitive pixel in the infrared imaging device according to the present embodiment will now be described with reference to FIGS. 5 and 6. The insensitive pixel 11 in this concrete example is a thermal insensitive pixel. Its top view is shown in FIG. 5, and a sectional view of the insensitive pixel 11 taken along a cut line B-B in FIG. 5 is shown in FIG. 6. The insensitive pixel 11 is formed on a SOI substrate in the same way as the sensitive pixel 12. Unlike the case of the sensitive pixel 12, however, the concave part 110 is not formed in an area of the SOI substrate where the insensitive pixel 11 is formed. The insensitive pixel 11 includes a plurality of (in FIGS. 5 and 6, two) diodes 14 formed in a SOI layer of the SOI substrate and connected in series, a wiring 120 which connects these diodes 14, a connection wiring 142a connected at its first terminal to a row selection line and connected at its second terminal to a first terminal of a series circuit formed of diodes connected in series, a connection wiring 142b connected at its first terminal to an associated vertical signal line and connected at its second terminal to a second terminal of the series circuit formed of the diodes connected in series, and an insulation film 125 formed to cover the diodes 14, the wiring 120, and the connection wirings 142a and 142b.

In the insensitive pixel 11 having such a configuration, heat generated by the diodes 14 is diffused to the insulation film 125, the buried insulation film 102 and the support substrate 101 disposed around the diodes 14. In other words, a thermal conductance between the diodes 14 and the structure surrounding the diodes 14 is higher than that in the sensitive pixel 12. Since the insensitive pixel 11 in this concrete example does not have the concave part 110, it has no heat accumulation function. Therefore, the insensitive pixel 11 in this concrete example reflects the temperature of the SOI substrate. Such an insensitive pixel is referred to as substrate temperature measurement pixel as well.

Figure 7:
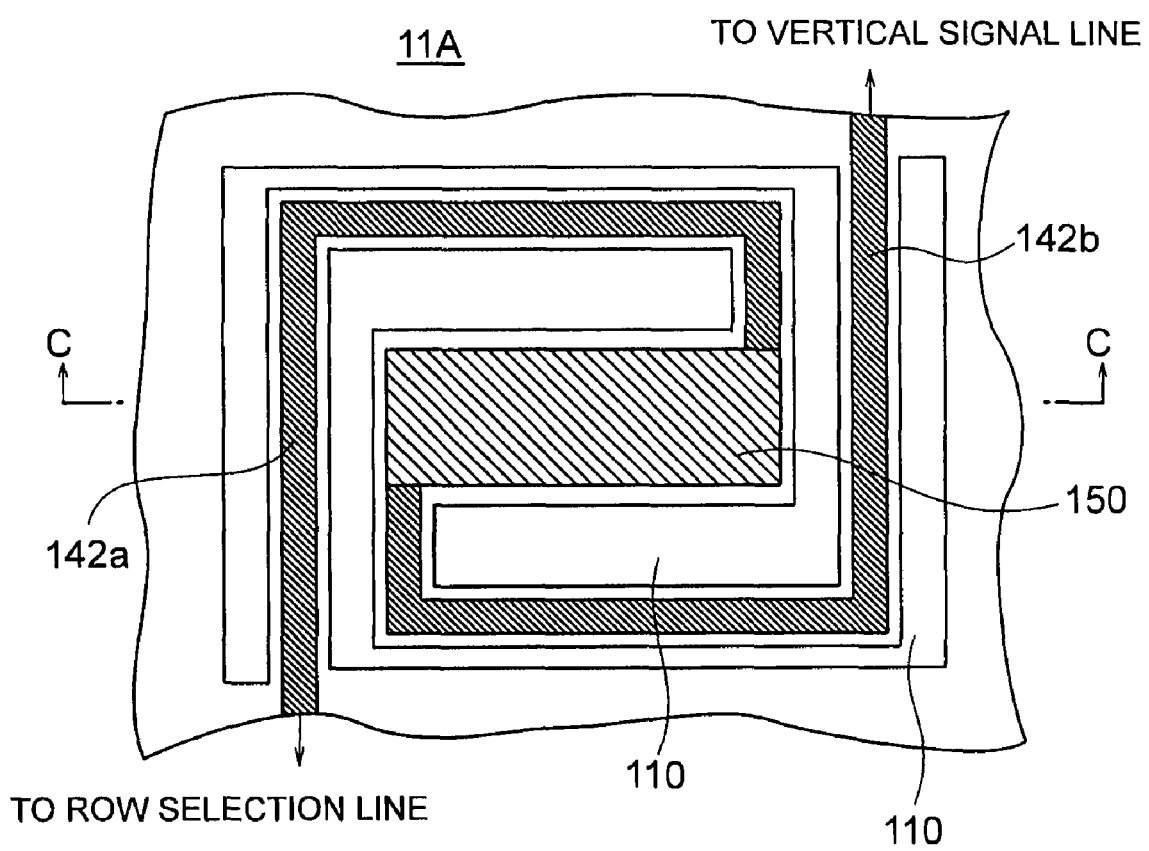
FIG. 7 is a top view of an infrared reflection pixel used in the infrared imaging device according to the embodiment.
Figure 8:
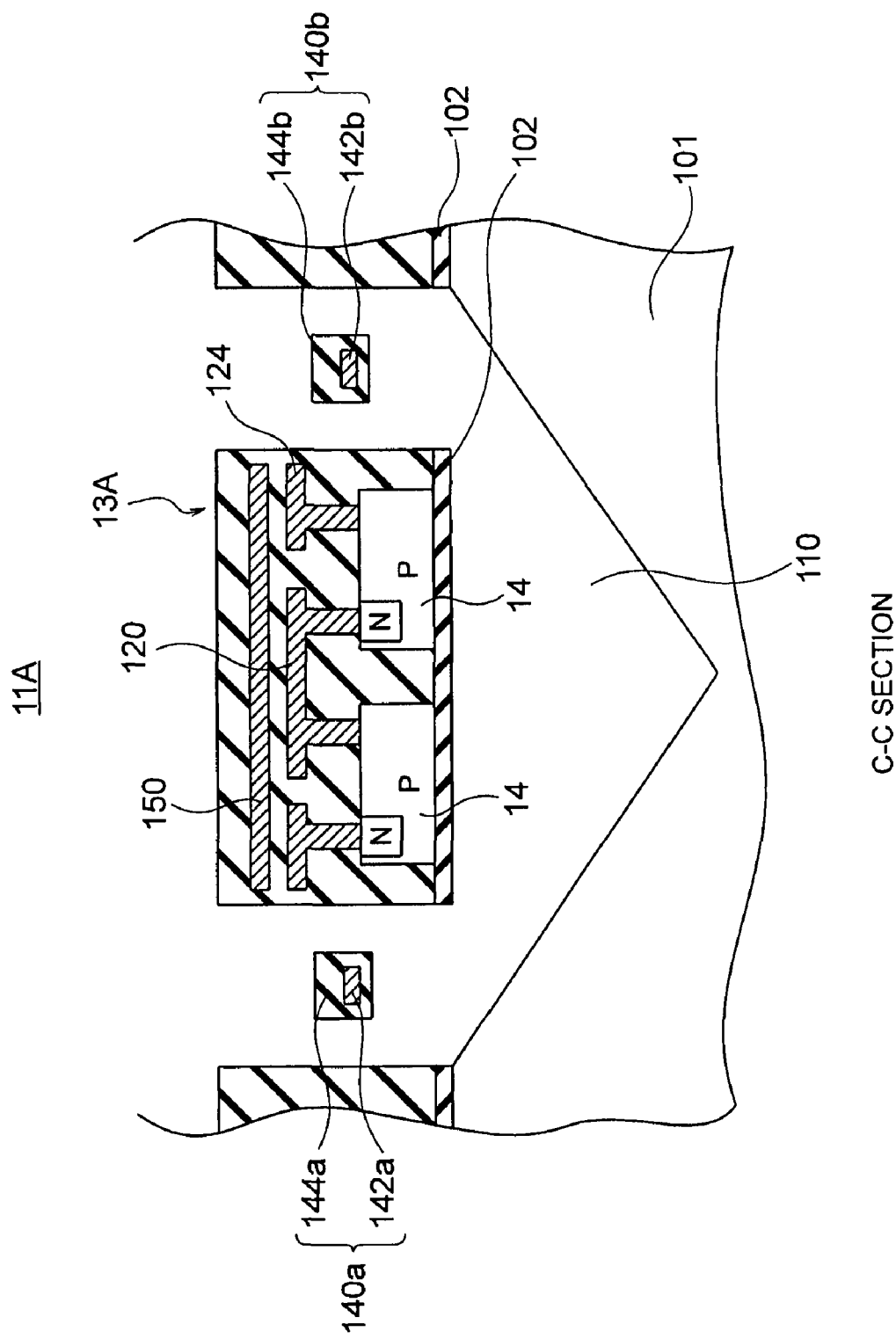
FIG. 8 is a sectional view of the infrared reflection pixel taken along a cut line C-C shown in FIG. 7.

A structure of another concrete example of an insensitive pixel in the infrared imaging device according to the present embodiment will now be described with reference to FIGS. 7 and 8. A top view of an insensitive pixel 11A in this concrete example is shown in FIG. 7, and a sectional view of the insensitive pixel 11A taken along a cut line C-C in FIG. 7 is shown in FIG. 8. The insensitive pixel 11A in this concrete example is formed on a SOI substrate having a concave part 110 formed in a surface part in the same way as the sensitive pixel 12. The insensitive pixel 11A includes a reflection unit 13A formed in the SOI layer, and support structure units 140a and 140b which support the reflection unit 13A over the concave part 110. The reflection unit 13A includes a plurality of (in FIG. 8, two) diodes 14 connected in series, a wiring 120 which connects these diodes 14, an infrared reflection film 150 formed to cover these diodes 14 and the wiring 120, and an infrared absorption film 124 formed to cover these diodes 14, the wiring 120, and the infrared reflection film 150. The support structure unit 140a includes a connection wiring 142a connected at its first terminal to an associated row selection line and connected at its second terminal to a first terminal of a series circuit formed of diodes connected in series, and an insulation film 144a which covers the connection wiring 142a. The other support structure unit 140b includes a connection wiring 142b connected at its first terminal to an associated vertical signal line and connected at its second terminal to a second terminal of the series circuit formed of diodes connected in series, and an insulation film 144b which covers the connection wiring 142b.

The insensitive pixel 11A having such a configuration is referred to as optical insensitive pixel as well. The insensitive pixel 11A is different from the sensitive pixel 12 in that the insensitive pixel 11A has the infrared reflection film 150 in the infrared absorption film 124. Since the optical insensitive pixel 11A reflects infrared rays, it is insensitive to infrared rays. As for other respects, since the optical insensitive pixel 11A has the same structure as the sensitive pixel 12, the optical insensitive pixel 11A is more suitable for the reference pixel than the substrate temperature measurement pixel (thermal insensitive pixel) 11. For example, a component generated by Joule heat when a current is let flow through the diodes 14 does not exist in the thermal insensitive pixel 11. In this respect, the thermal insensitive pixel 11 is different from the sensitive pixel 12. However, the optical insensitive pixel 11A has the same temperature component except a temperature change caused by infrared rays. It is desirable to use aluminum for the infrared reflection film 150 in order to reflect infrared rays sufficiently. Furthermore, the infrared reflection film 150 may be formed in the same layer as a wiring layer in which operational amplifiers are formed. In this case, the manufacturing process can be shortened and the cost can be reduced.

As for the temperature of the infrared detection pixel 12, Joule heat generated when the thermoelectric conversion unit 13 is selected is added to the temperature of the semiconductor substrate formed of the support substrate 101 and the buried insulation film 102, and in addition a temperature component associated with the infrared signal is added. Supposing that the temperature of the semiconductor substrate is, for example, 25° C. Joule heat becomes approximately 0.1° C. and the temperature component associated with the infrared signal becomes the order of approximately 0.01° C. when the temperature of the subject changes by 1° C.

The infrared reflection pixel 11A has temperature components generated by the temperature of the semiconductor substrate and Joule heat among the three temperature components in the same way as the infrared detection pixel 12. The infrared reflection pixel 11A can be said to be a faithful insensitive pixel in that the temperature components are reproduced.

On the other hand, the thermal insensitive pixel 11 does not have a temperature component generated by Joule heat. Since the thermal insensitive pixel 11 does not have the concave part 110, however, the variation of I-V characteristics among pixels generated by the concave part 110 is small. Therefore, there is a merit that the variation of the reference voltage value among elements can be suppressed by applying the thermal insensitive pixel.

Figure 9:
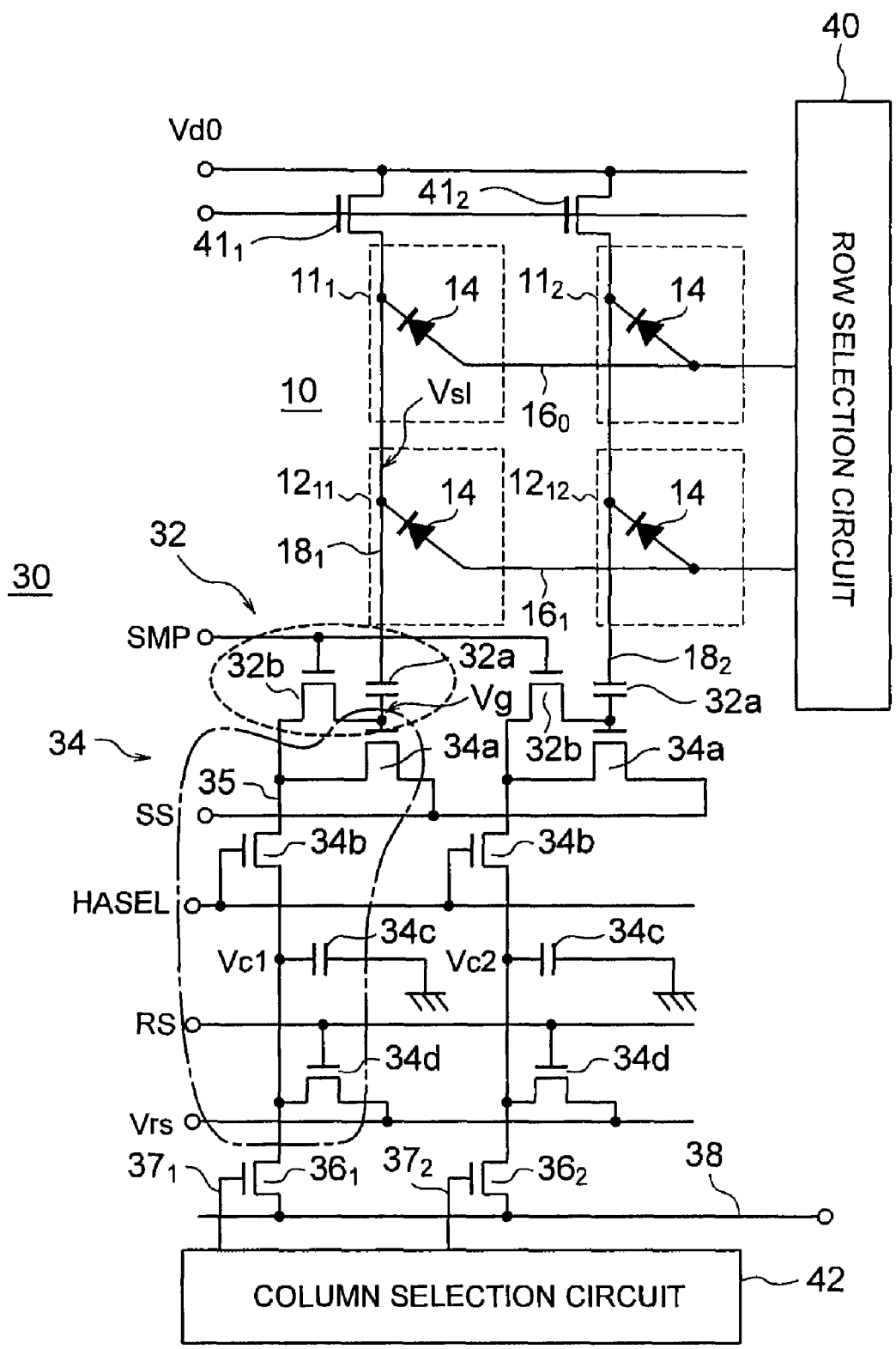
FIG. 9 is a circuit diagram showing a concrete example of an infrared detection unit using the infrared imaging device according to the embodiment.
Figure 10:
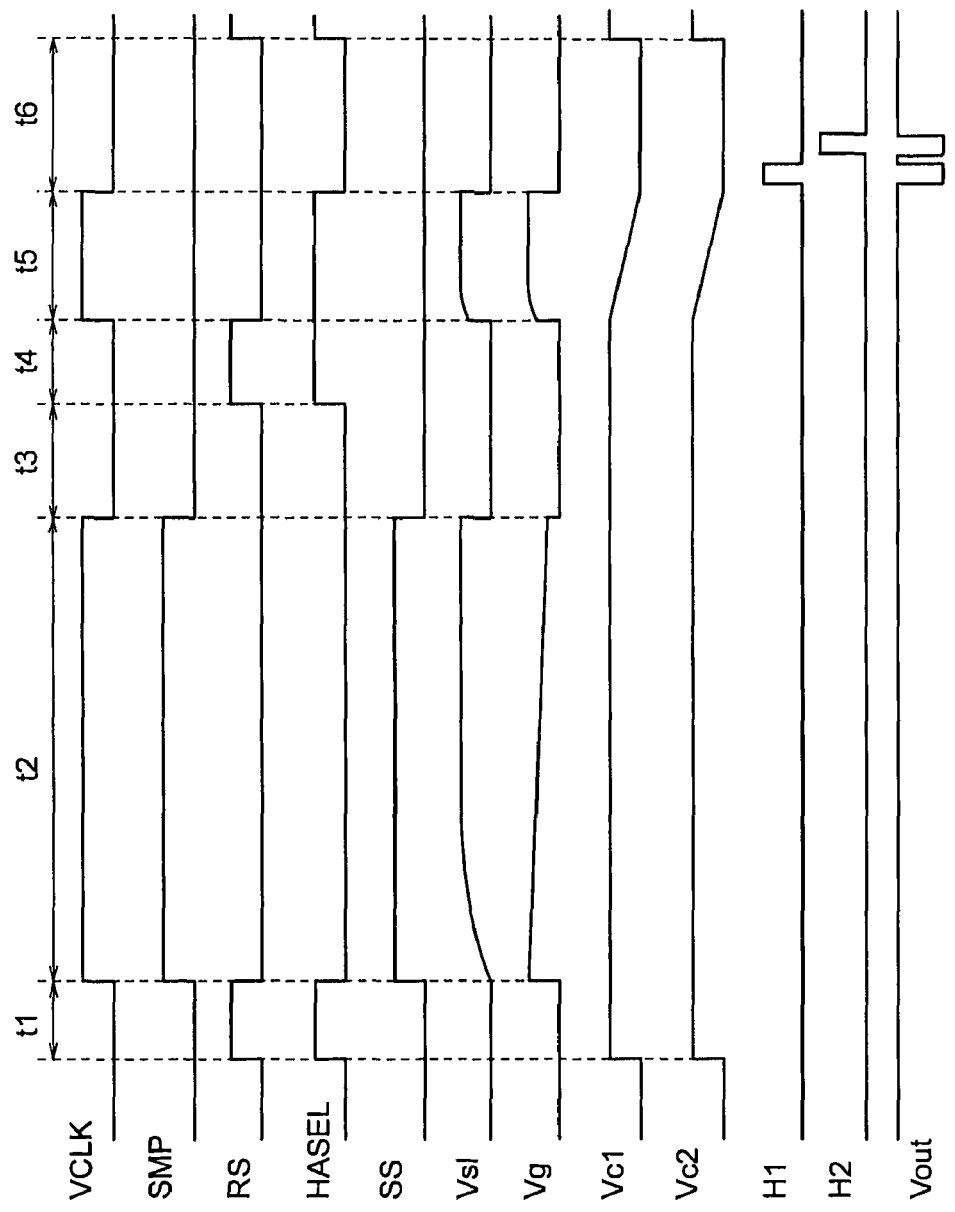
FIG. 10 is a waveform diagram for explaining operation of the infrared detection unit shown in FIG. 9.

A configuration and operation of the infrared detection unit in the infrared imaging device according to the present embodiment will now be described with reference to FIGS. 9 and 10. FIG. 9 is a circuit diagram showing a configuration of a concrete example of the infrared detection unit according to the present embodiment. In this concrete example, it is supposed that four pixels arranged in two rows by two columns are provided in the imaging area 10 as shown in FIG. 9 for brevity of description. Pixels $11_1$ and $11_2$ in a first row are insensitive pixels, and pixels $12_{11}$ and $12_{12}$ in a second row are sensitive pixels (infrared detection pixels).

Each of the pixels $11_1$, $11_2$, $12_{11}$, and $12_{12}$ has at least one thermoelectric conversion element, such as, for example, a diode 14 formed of a pn junction.

An anode of a diode 14 in each of the insensitive pixels $11_1$ and $11_2$ in the first row is connected to a row selection line $16_0$, and an anode of a diode 14 in each of the sensitive pixels $12_{11}$ and $12_{12}$ in the second row is connected to a row selection line $16_1$. The row selection lines $16_0$ and $16_1$ are selected successively row by row by a row selection circuit 40, and the bias voltage Vd is applied to the selected row selection line.

A cathode of the diode 14 in each of the pixels $11_1$ and $12_{11}$ in the first column is connected to a vertical signal line (hereafter referred to simply as signal line) $18_1$ in the first column, and a cathode of the diode 14 in each of the pixels $11_2$ and $12_{12}$ in the second column is connected to a vertical signal line $18_2$ in the second column.

A first terminal of each vertical signal line $18_i$ (i=1, 2) is connected to a drain of a load transistor $41_i$, and a second terminal of each vertical signal line $18_i$ is connected to a positive side input terminal of a differential amplification circuit 34. Each load transistor $41_i$ (i=1, 2) operates in a saturation region, and supplies a constant current to an associated vertical signal line in response to a gate voltage applied to its gate. In other words, the load transistor $41_i$ (i=1, 2) functions as a constant current source. A source voltage of the load transistor $41_i$ (i=1, 2) is set equal to Vd0.

If the row selection circuit 40 applies the bias voltage Vd to the diode 14 in the selected row, a voltage Vd−Vd0 is applied to the diode 14 in a sensitive pixel in the selected row. Since all diodes 14 in unselected rows are reverse-biased, the row selection lines $16_1$ and $16_2$ are isolated from the signal lines $18_1$ and $18_2$. In other words, it can be said that the diodes 14 fulfill a pixel selection function.

A potential on the vertical signal lines $18_1$ and $18_2$ when infrared rays are not received is defined as Vs1. Upon receiving infrared rays, the pixel temperature in the infrared detection pixels $12_{11}$ and $12_{12}$ rises. As a result, the potential Vs1 on the vertical signal lines $18_1$ and $18_2$ becomes higher. For example, if the subject temperature changes by 1 K (Kelvin), the temperature of the infrared detection pixels $12_{11}$ and $12_{12}$ changes by approximately 5 mK. If the thermoelectric conversion efficiency is 10 mV/K, then the potential on the vertical signal lines $18_1$ and $18_2$ rises by approximately 50 μV. This is very small as compared with the bias voltage Vd.

Furthermore, since the infrared detection pixels $12_{11}$ and $12_{12}$ change in characteristics reflecting the temperature of the semiconductor substrate, discrimination between the signal and the substrate temperature is impossible. In other words, for example, even if the environmental temperature changes by only 1 K, an output change which is equivalent to approximately 200 times the infrared signal is generated.

Since the insensitive pixels $11_1$ and $11_2$ are insensitive to infrared rays, the insensitive pixels $11_1$ and $11_2$ reflect only the temperature information of the semiconductor substrate. If signal differences between the infrared detection pixels $12_{11}$ and $12_{12}$ and the insensitive pixels $11_1$ and $11_2$ are found, only the infrared information can be detected.

Each sample unit 32 in the readout circuit 30 includes coupling capacitance 32a and a sampling transistor 32b. A first terminal of the coupling capacitance 32a is connected to an associated vertical signal line, and a second terminal of the coupling capacitance 32a is connected to a source of a sampling transistor 32b. Furthermore, a sampling signal SMP is applied to a gate of each sampling transistor 32b.

Each of the amplification units 34 in the readout circuit 30 includes an amplification transistor 34a, a switching transistor 34b, storage capacitance 34c, and a reset transistor 34d. A gate of the amplification transistor 34a is connected to a second terminal of the coupling capacitance 32a. A drain 35 of the amplification transistor 34a is connected to a drain of the sampling transistor 32b. A source of the amplification transistor 34a is connected to a source line SS. The switching transistor 34b receives a control signal HASEL at its gate. A source of the switching transistor 34b is connected to a drain of the amplification transistor 34a. A first terminal of the storage capacitance 34c is connected to a drain of the switching transistor 34b, and a second terminal of the storage capacitance 34c is connected to ground. The reset transistor 34d receives a reset signal RS at its gate. A source of the reset transistor 34d is connected to the drain of the switching transistor 34b. The reset transistor 34d receives a reset potential Vrs at its drain.

A column selection switch (column selection transistor) $36_i$ (i=1, 2) receives a selection signal $37_i$ from the column selection circuit 42 at its gate. A source of the column selection switch $36_i$ is connected to the source of the reset transistor 34d. A drain of the column selection switch $36_i$ is connected to the horizontal signal line 38.

Operation of the infrared detection unit 1 in the present embodiment will now be described with reference to FIG. 10. FIG. 10 is a waveform diagram for explaining operation of the infrared detection unit 1 in the present embodiment.

First, the reset transistor 34d and the switching transistor 34b are turned on by bringing the reset signal RS and the control signal HASEL to an "H" level in a reset term t1 which immediately precedes a row selection term t2 of the substrate temperature measurement pixel (insensitive pixel) 11. Since the reset potential Vrs is applied to the drain of the reset transistor 34d at this time, a wiring as far as the drain 35 of the amplification transistor 34a assumes the reset potential Vrs. Furthermore, a reset charge corresponding to the reset potential Vrs is stored on each of the storage capacitances 34c associated with the vertical signal lines in the first column and the second column. In FIG. 10, voltages on the storage capacitances 34c associated with the vertical signal lines in the first column and the second column are denoted by Vc1 and Vc2, respectively.

Thereafter, in a row selection term t2 of an insensitive pixel, the reset transistor 34d and the switching transistor 34b are turned off by bringing the reset signal RS and the control signal HASEL to an "L" level. At this time, the drain 35 of the amplification transistor 34a is isolated. During this term, a control signal VCLK which selects the row selection line $16_0$ from the row selection circuit 40 becomes an "H" level, and the row selection circuit 40 applies the bias voltage Vd to the row selection line $16_0$. At this time, a potential on the source of the amplification transistor 34a is brought to Vs by bringing the sampling signal SMP to an "H" level to turn on the sampling transistor 32b and bringing a potential on the source line SS to Vs. At this time, a potential Vs1 on the vertical signal line $18_1$ and a potential Vg on the gate of the amplification transistor 34a change transitionally as shown in FIG. 10. Since the gate potential Vg and a drain potential Vdr of the amplification transistor 34a become the same potential, a current flows from the drain to the source in accordance with the gate potential Vg. The amplification transistor 34a operates in a saturation region because of a relation Vdr=Vg>Vg−Vth. Here, Vth is a threshold voltage of the amplification transistor 34a. A current which flows through the amplification transistor is proportionate to $(Vg-Vs-Vth)^2$, and approaches a threshold Vs+Vth while supplying a negative charge to the coupling capacitance 32a.

Denoting a forward voltage of an insensitive pixel corresponding to a constant current If by Vref, the potential Vs1 on the vertical signal line at the time when the sampling transistor 32b is turned off becomes Vd−Vref. However, the potential Vs1 on the vertical signal line is limited to a potential defined as a sum of the gate potential Vg of the amplification transistor 34a and a voltage Vcc of the coupling capacitance 32a. Supposing that the coupling capacitance 32a has a capacitance Ccc, therefore, relations Vs1=Vd−Vref and Vg=Vth+Vcc are satisfied only when a negative charge represented by $$Qg=-(Vd-Vref-Vth-Vs)/Ccc \quad (1)$$

is stored on the amplification transistor 34a side.

After the row selection term t2 of the insensitive pixel has finished, the sampling transistor 32b is turned off and the charge on the coupling capacitance 32a is held at the value Qg by bringing the sampling signal SMP to the "L" level (term t3).

Then, in a reset term t4, the switching transistor 34b and the reset transistor 34d are turned on and the drain potential 35 of the amplification transistor 34a is returned to the reset potential Vrs again by bringing the control signal HASEL and the reset signal RS to the "H" level.

Then, the bias voltage Vd is applied to the row selection line $16_1$ by bringing the row selection signal VCLK to an "H" level. Thereupon, a forward voltage (=Vref−Vsh−Vsig) is applied to the diodes 14 in the infrared detection pixels 12₁₁ and 12₂₂. Here, it is supposed that the insensitive pixels 11 are substrate temperature measurement pixels. The infrared detection pixel indicates a forward voltage which is lower than that of the substrate temperature measurement pixel by a voltage component Vsh which reflects self heating caused by Joule heat and a temperature rise component Vsig caused by infrared absorption.

Therefore, the potential on the vertical signal lines 18₁ and 18₂ becomes:

$$Vs1 = Vd - Vref + Vsh + Vsig$$

and the gate voltage of the amplification transistor 34a becomes:

$$Vg = (Vd - Vref + Vsh + Vsig) - (Vd - Vref - Vth - Vs) \quad (2)$$
$$= Vsh + Vsig + Vth + Vs$$

Thereupon, a current Ids represented by $$Ids \propto (Vg - Vth)^2 = (Vsh + Vsig + Vs)^2 \quad (3)$$

flows between the drain and source of the amplification transistor 34a. As appreciated from Expression (3), a mutual conductance $g_m$ of the amplification transistor 34a can be controlled depending upon magnitude of Vs.

In a selection interval t5 of the infrared detection pixel, the reset transistor 34d is turned off by bringing the reset signal RS to the "L" level and the switching transistor 34b is held in the on-state by keeping the control signal HASEL at the "H" level in succession from the term t4. As a result, charge stored on the storage capacitance 34c in each column is swept out to the source side of the amplification transistor 34a.

In a horizontal readout term t6, the quantity of decrease of the charge on the storage capacitance 34c is read out successively by applying pulses H1 and H2 respectively to the gates of the column selection transistors 36₁ and 36₂ in order. Signals in respective columns stored during the selection term t5 of the infrared detection pixel are read out onto the horizontal signal line 38 as a time series signal Vout and output via the buffer 44.

Owing to this circuit operation, that is, the Vth clamp operation, it becomes possible to amplify and read out only components obtained by excluding the substrate temperature component from the temperature components the infrared detection pixel has, that is, the infrared signal component and the self heating component. In this way, an infrared imaging device which is not affected by the environmental temperature can be implemented.

Furthermore, owing to this Vth clamp operation, it is possible to compensate the threshold variations of the amplification transistors 34a in the pixel columns and suppress fixed longitudinal streak noise which does not depend on time.

Every time the Vth clamp processing is conducted, however, random noise is superposed on the coupling capacitance 32a. A voltage $V_{sample}(x)$ represented by the following Expression (4) is stored on the coupling capacitance C(x) having a column number x.

$$V_{sample}(x) = V_{ref}(x) + \sqrt{\left(\frac{kT}{C(x)} + \delta V_{1/f\_ref}(x)^2\right)} \quad (4)$$

Where Vref(x) is a DC component included in an output signal of the insensitive pixel 11 having a column number x, and it contains the substrate temperature information. A root part is a noise component included in the stored voltage, and it is a root of a sum of reset noise (=kT/C(x)) which is necessarily generated when a voltage is stored on the coupling capacitance 32a and a square sum of fluctuating noise that is 1/f noise ($\delta V_{1/f\_ref}(x)$) of an insensitive pixel. It is a problem that this noise component varies every time sampling is conducted. Here, k is the Boltzmann constant, and T is the absolute temperature (K) of the coupling capacitance 32a.

Figure 11:
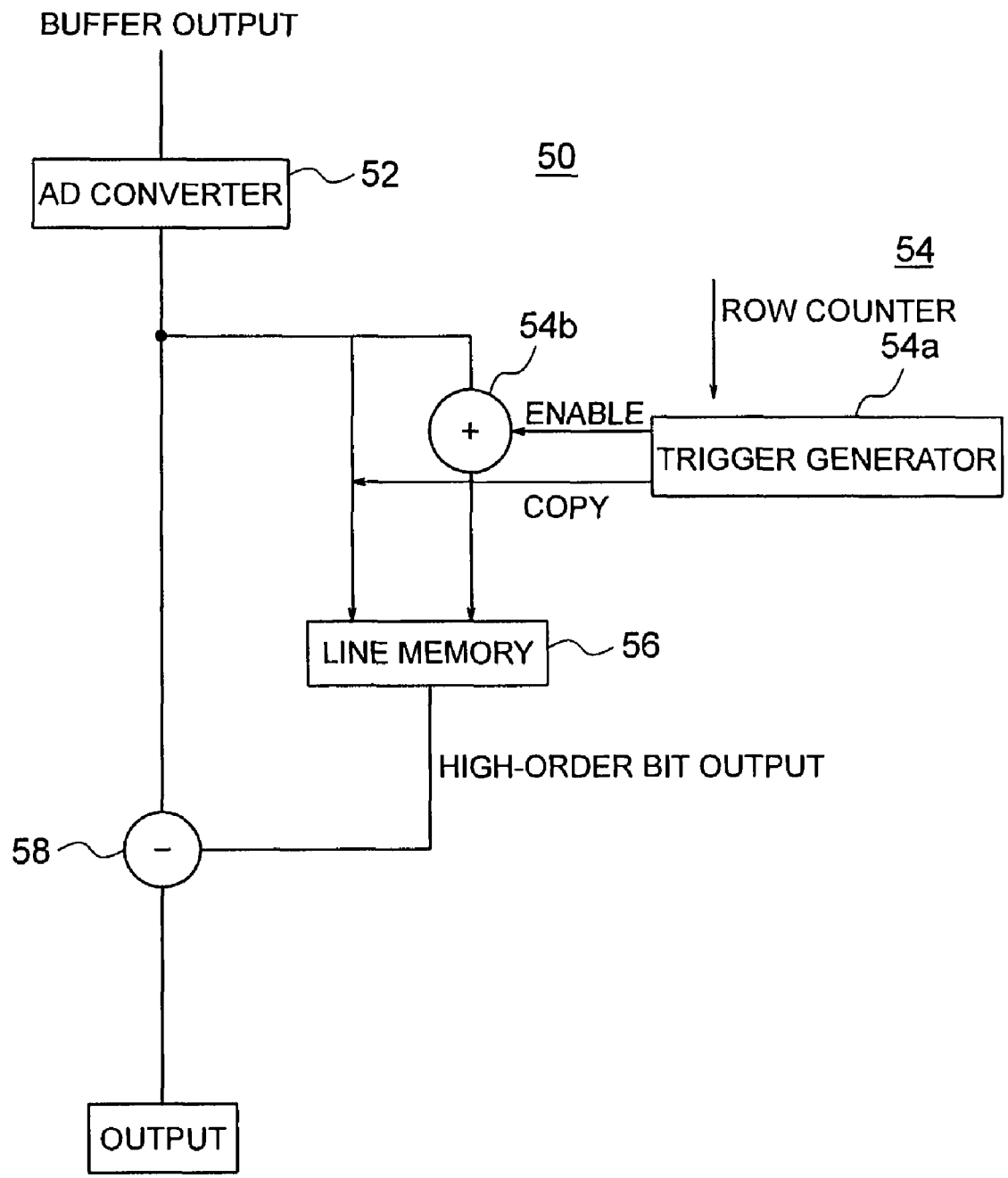
FIG. 11 is a circuit diagram showing a concrete example of a signal processing unit used in the infrared imaging device according to the embodiment.

In the present embodiment, therefore, noise subtraction processing is conducted in the signal processing unit 50 in order to reduce the noise component. A circuit diagram of a concrete example of the signal processing unit 50 is shown in FIG. 11. The signal processing unit 50 in this concrete example includes an AD conversion unit 52, an average value calculation unit 54, a trigger generation unit 54, a line memory 56, and a subtraction unit 58. The average value calculation unit 54 includes a trigger generation unit 54a and an addition unit 54b.

If an insensitive pixel row is selected again after sampling processing, a difference from a sampled voltage is found in each column, and the difference is amplified by the amplification unit 34 and output, then an output signal Vout(x) becomes as represented by the following Expression (5).

$$Vout(x) = \text{gain} \times \left(\sqrt{\frac{kT}{C(x)} + \delta V_{1/f\_ref}(x)^2} + \delta V_{1/f\_ref}(x)\right) \quad (5)$$

Expression (5) represents that the 1/f noise of the newly selected insensitive pixel is added to the sampled noise voltage and the sum is amplified. This value is subject to analog/digital conversion in the AD conversion unit 52 and stored in the line memory 56. If the infrared detection unit 1 is formed of 160 by 120 pixels and the AD conversion unit 52 outputs 16 bits, a line memory having a size of 160 words by 20 bits is used as the line memory 56 (we appreciate knowing about why the line memory needs to have the above size).

For reducing the 1/f noise generated by each pixel in an insensitive pixel column, it is desirable to select an insensitive pixel column a plurality of times, acquire the noise voltage represented by Expression (5) a plurality of times, and find an average. If an insensitive pixel column is selected N times and averaging is conducted, then the averaged voltage value becomes as represented by the following Expression (6), and the 1/f noise of the insensitive pixel is reduced according to the number of times of selection.

$$Vout(x) = \text{gain} \times \left(\sqrt{\frac{kT}{C(x)} + \delta V_{1/f\_ref}(x)^2} + \frac{\delta V_{1/f\_ref}(x)}{\sqrt{N}}\right) \quad (6)$$

If, for example, N=16, then signals of insensitive pixel rows corresponding to 16 times are successively added in the line memory 56.

Hereafter, a method of signal averaging in insensitive pixel rows will be described. When starting signal acquisition of insensitive pixel rows, the trigger generation unit 54a outputs a COPY signal and copies the digital value of the signal in the insensitive pixel row to the line memory 56 as it is. Incidentally, a row counter is input to the trigger generation unit 54a to make it possible to know the current processing row. In a second row and subsequent rows after the acquisition start, the trigger generation unit 54a outputs an ENABLE signal, a new signal of an insensitive pixel row is added successively in the line memory 56. The signal of the insensitive pixel row is 160 16-bit data corresponding to the number of columns, and data of respective columns are added respectively. When addition corresponding to 16 times is finished, a value having magnitude corresponding to 16 bits+4 bits=20 bits is written into the line memory 56. By outputting 16 high-order bits among them, sum data corresponding to 16 times is divided by 16, resulting in average value data.

In succession, an infrared detection pixel row is selected and a voltage represented by the following Expression (7) is output:

$$Vout(x, y) = \text{gain} \times \left( V_{signal}(x, y) + \sqrt{\frac{kT}{C(x)} + \delta V_{1/f\_ref}(x)^2} + \delta V_{1/f}(x, y) \right) \quad (7)$$

The subtraction unit 58 calculates a difference between Expression (7) and Expression (6) for each column. An output signal value after the subtraction is represented by the following Expression (8):

$$Vout(x, y) = \text{gain} \times \left( V_{signal}(x, y) + \delta V_{1/f}(x, y) + \frac{\delta V_{1/f\_ref}(x)}{\sqrt{N}} \right) \quad (8)$$

As appreciated from Expression (8), noise voltage at the time of sampling is canceled except the final term.

According to the present embodiment, it becomes possible to reduce the longitudinal streak noise caused by random noise at the time of readout (the time of sampling) and raise the S/N ratio with a simple algorithm while maintaining the compensation of the threshold variations of the transistors in the amplifiers in the columns and the substrate temperature compensation characteristics, which are merits of the Vth clamp operation, as described heretofore.

Incidentally, in the above-described embodiment, one reference pixel row formed of reference pixels (insensitive pixels) is used. However, a plurality of reference pixel rows may be used. Furthermore, the reference pixel row may be provided in an arbitrary row in the imaging area.

In the embodiment, the thermoelectric conversion element is a diode simple substance or diodes connected in series. However, the thermoelectric conversion element may be a resistor.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. An infrared imaging device comprising:
a semiconductor substrate;
an imaging area formed on the semiconductor substrate, the imaging area having a plurality of pixels arranged in a matrix form, the plurality of pixels including a plurality of reference pixels arranged in at least one row and a plurality of infrared detection pixels arranged in remaining rows to detect incident infrared rays, each of the reference pixels having a first thermoelectric conversion element, each of the infrared detection pixels having a thermoelectric conversion unit, the thermoelectric conversion unit having an infrared absorption film to absorb the incident infrared rays and convert the incident infrared rays to heat and a second thermoelectric conversion element to convert the heat obtained by the conversion conducted by the infrared absorption film to an electric signal;
a plurality of row selection lines provided in the imaging area to be associated with the rows of the plurality of pixels, each of the row selection lines being connected to first terminals of the first and second thermoelectric conversion elements of the pixels in an associated row to select a pixel in the associated row;
a plurality of signal lines provided in the imaging area to be associated with columns of the plurality of pixels, each of the signal lines being connected to second terminals of the first and second thermoelectric conversion elements of the pixels in an associated column to read out an electric signal from a pixel in the associated column;
a plurality of sample units provided to be associated with the signal lines, each of the sample units sampling and holding electric signals of pixels in an identical row sent from an associated signal line;
a plurality of amplification units provided to be associated with the sample units, each of the amplification units amplifying and outputting the electric signal held by an associated sample unit;
a readout unit which reads out outputs of the plurality of amplification units successively;
an AD conversion unit which conducts AD conversion on the electric signal read out by the readout unit;
a memory unit which selects the plurality of reference pixels arranged in the at least one row a plurality times, and calculates and stores an average value of electric signals in the plurality times from the selected reference pixels converted by the AD conversion unit, every pixel column; and
a subtraction unit which calculates a difference between an electric signal from the plurality of infrared detection pixels converted by the AD conversion unit and the average value stored in the memory unit, every pixel column.

2. The device according to claim 1, wherein the memory unit includes a line memory.

3. The device according to claim 1, wherein
a plurality of concave portions arranged in a matrix form to be associated with the plurality of infrared detection pixels are formed in a surface portion of the semiconductor substrate,
each of the infrared detection pixels further includes first and second support structure units to support the second thermoelectric conversion unit over an associated concave portion,
the first support structure unit has a first connection wiring connected at a first terminal thereof to a row selection line connected to an associated infrared detection pixel and connected at a second terminal to a first terminal of a second thermoelectric conversion element of the associated infrared detection pixel, and
the second support structure unit has a second connection wiring connected at a first terminal thereof to a signal line connected to the associated infrared detection pixel and connected at a second terminal to a second terminal of the second thermoelectric conversion element of the associated infrared detection pixel.

4. The device according to claim 1, wherein the reference pixel is a thermal insensitive pixel which does not have sensitivity to heat of the incident infrared rays.

5. The device according to claim 1, wherein
the reference pixel is an optical insensitive pixel having an infrared reflection film formed to cover the first thermoelectric conversion element and reflect the incident infrared rays, and a concave portion is formed in a surface portion of the semiconductor substrate under the reference pixel.

6. The device according to claim 1, wherein each of the first and second thermoelectric conversion elements comprises diodes connected in series.

7. The device according to claim 1, wherein each of the first and second thermoelectric conversion elements comprises resistors connected in series.

\* \* \* \* \*